United States Patent
Nishigaki et al.

(10) Patent No.: US 7,732,990 B2
(45) Date of Patent: Jun. 8, 2010

(54) PIEZOELECTRIC DRIVEN MEMS DEVICE

(75) Inventors: Michihiko Nishigaki, Kawasaki (JP);
Toshihiko Nagano, Kawasaki (JP);
Takashi Miyazaki, Kawasaki (JP);
Kazuhiko Itaya, Yokohama (JP);
Takashi Kawakubo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 573 days.

(21) Appl. No.: 11/683,755

(22) Filed: Mar. 8, 2007

(65) Prior Publication Data

US 2007/0228887 A1    Oct. 4, 2007

(30) Foreign Application Priority Data

Mar. 31, 2006    (JP) .............................. 2006-098556

(51) Int. Cl.
*H01L 41/08* (2006.01)
(52) U.S. Cl. ...................... 310/331; 310/317; 310/319; 310/332
(58) Field of Classification Search ................. 310/332, 310/331, 367, 368
See application file for complete search history.

(56) References Cited

U.S. PATENT DOCUMENTS

| | | | | | |
|---|---|---|---|---|---|
| 4,093,883 | A | * | 6/1978 | Yamamoto | 310/317 |
| 4,893,048 | A | * | 1/1990 | Farrall | 310/331 |
| 5,072,288 | A | * | 12/1991 | MacDonald et al. | 257/420 |
| 7,068,474 | B2 | * | 6/2006 | Kuwajima et al. | 360/294.4 |
| 7,145,284 | B2 | * | 12/2006 | Ikehashi | 310/348 |
| 7,446,457 | B2 | * | 11/2008 | Ikehashi | 310/330 |
| 7,471,031 | B2 | * | 12/2008 | Kawakubo et al. | 310/330 |
| 2005/0194867 | A1 | | 9/2005 | Kawakubo et al. | |
| 2006/0055287 | A1 | | 3/2006 | Kawakubo et al. | |

FOREIGN PATENT DOCUMENTS

| | | |
|---|---|---|
| JP | 2003-181800 | 7/2003 |
| JP | 2006-087231 | 3/2006 |

OTHER PUBLICATIONS

Korean Office Action dated Feb. 23, 2009 corresponding to U.S. Appl. No. 11/683,755, filed Mar. 8, 2007.

* cited by examiner

*Primary Examiner*—Mark Budd
(74) *Attorney, Agent, or Firm*—Turocy & Watson, LLP

(57) ABSTRACT

A MEMS device includes: a first actuator having a first fixed end, including a stacked structure of a first lower electrode, a first piezoelectric film, and a first upper electrode, and being able to be operated by applying voltages to the first lower electrode and the first upper electrode; a second actuator having a second fixed end, being disposed in parallel with the first actuator, including a stacked structure of a second lower electrode, a second piezoelectric film, and a second upper electrode, and being able to be operated by applying voltages to the second lower electrode and the second upper electrode; and an electric circuit element having a first action part connected to the first actuator and a second action part connected to the second actuator.

13 Claims, 13 Drawing Sheets

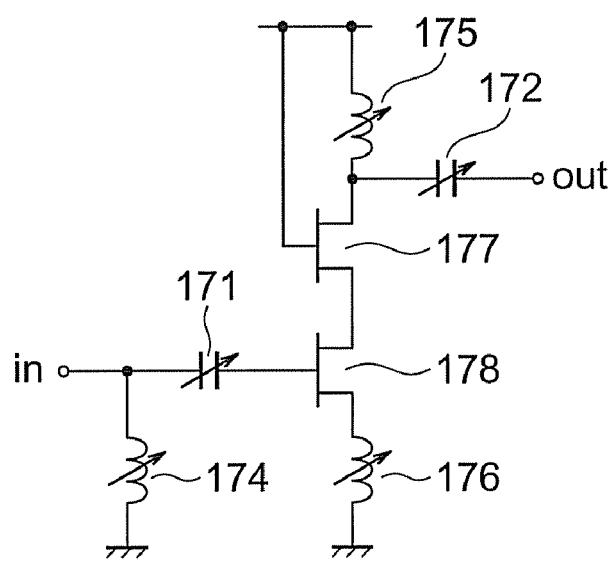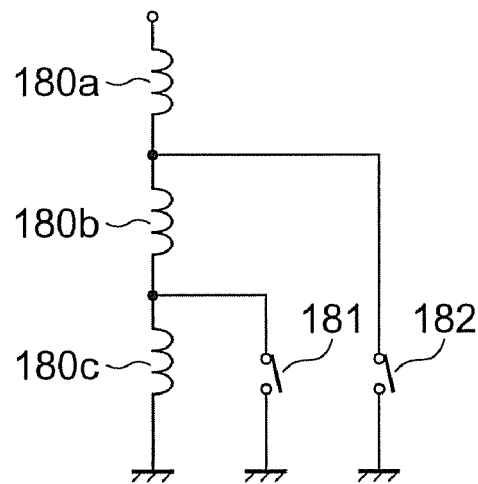
FIG. 14A                    FIG. 14B

PIEZOELECTRIC DRIVEN MEMS DEVICE

CROSS-REFERENCE TO RELATED APPLICATION

This application is based upon and claims the benefit of priority from prior Japanese Patent Application No. 2006-98556 filed on Mar. 31, 2006 in Japan, the entire contents of which are incorporated herein by reference.

BACKGROUND OF THE INVENTION

1. Field of the Invention

The present invention relates to a piezoelectric driven MEMS (Micro-electro-mechanical System) actuator.

2. Related Art

Recently, actuators fabricated by using the MEMS technique are drawing the attention. The actuators are driven by electrostatic force, thermal stress, electromagnetic force, piezoelectric force, and so on, and bent and displaced. An actuator using a piezoelectric thin film to rotate a shaft attached to a free end is known (see, for example, JP-A 2003-181800 (KOKAI)).

Furthermore, MEMS devices such as variable capacitance type capacitors and switches using actuators are being studied. The variable capacitance type capacitors and switches using the MEMS technique has, for example, a configuration in which an actuator supported at its first end by a strut provided on a substrate is provided, a movable electrode serving as an action part is provided at a second end of the actuator, a fixed electrode is provided on the substrate surface so as to be opposed to the second end of the actuator, and the distance between the movable electrode and the fixed electrode is changed by the actuator. In other words, the actuator serves as a movable beam.

Especially in the variable capacitance type capacitor including a piezoelectric driven actuator which uses an inverse piezoelectric effect or an electrostrictive effect as drive force for the movable beam, the spacing between the movable electrode and the fixed electrode can be changed sharply and continuously, and consequently the capacitance change rate can be made large. Furthermore, since air or gas can be used as a dielectric between the movable electrode and the fixed electrode, a very large Q factor is obtained. Thus, the variable capacitance type capacitor has a large number of advantages.

Furthermore, it is also possible to cause the variable capacitance type capacitor structure to function as a switch by bringing the movable electrode into contact with the fixed electrode via an extremely thin dielectric film (capacitive type) or bringing the movable electrode into contact with the fixed electrode directly (contact type). Such a switch fabricated by using the MEMS technique has both low on-resistance and high off-condition isolation characteristics as compared with the semiconductor switch, and it is also drawing keen attention.

However, the piezoelectric driven actuator is supported in the air, and has a long thin beam structure including a piezoelectric film interposed between upper and lower electrodes. Therefore, there is a very serious problem that the beam is warped upward or downward by slight residual stress in the material of the piezoelectric film. As a result, it is very difficult to adjust the capacitance value of the variable capacitance type capacitor obtained before and after applying the voltage in conformity with the design and make the drive voltage of the switch a constant value.

For example, in the action part connected to the piezoelectric driven actuator, a bendable displacement quantity D caused by the inverse piezoelectric effect is represented by the following expression.

$$D \sim E \cdot d_{31} \cdot L^2 / t \quad (1)$$

Here, E is an electric field applied to the piezoelectric film, $d_{31}$ is a piezoelectric strain constant, L is the length of the actuator, and t is the thickness.

On the other hand, denoting residual strain by $S_r$, warp $D_w$ of the piezoelectric driven actuator caused by residual strain which is generated in the piezoelectric film when forming the film is approximated by the following expression.

$$D_W \sim S_r \cdot L^2 / t \quad (2)$$

As appreciated by comparing the expression (2) with the expression (1), the displacement quantity D and the warp $D_W$ have similar relations to the length L and the thickness t of the piezoelectric driven actuator. The displacement quantity D and the warp $D_W$ are in proportion to the square of the length L, and are inverse proportion to the thickness t. For example, if the length L of the actuator is increased or the thickness t is decreased in order to widen the drive range of the piezoelectric driven actuator, the quantity of the warp $D_W$ also increases accordingly. In making the piezoelectric driven range D greater than the warp $D_W$, therefore, geometric contrivance concerning the actuator brings about little effect. There are no ways other than making the absolute value of the residual strain $S_r$ small as compared with the absolute value of piezoelectric strain ($E \cdot d_{31}$) caused by the inverse piezoelectric effect.

For obtaining a high quality film as regards lead zirconate titanate (PZT) known as a piezoelectric film having a great inverse piezoelectric effect, it is necessary to form a film at the room temperature and then conduct annealing at approximately 600° C. Since the volume contraction is caused by the annealing, the residual strain of the piezoelectric film formed of PZT increases inevitably. On the other hand, aluminum nitride (AlN) and zinc oxide (ZnO) used as the material of the piezoelectric film, which can be formed near at the room temperature and can be controlled in film forming residual stress comparatively precisely by using the film forming condition, are smaller in inverse piezoelectric effect by at least one digit than PZT.

If a piezoelectric material that is great in inverse piezoelectric effect is used as the piezoelectric film of the piezoelectric driven actuator in order to increase the piezoelectric strain, it becomes difficult to control the residual strain and the warp cannot be controlled, as described above. If a piezoelectric material that is comparatively easy in control of residual strain in the piezoelectric film is used, then the inverse piezoelectric effect is small and the piezoelectric driven range cannot be made sufficiently large as compared with the warp of the actuator.

Industrial application of the piezoelectric driven actuator is obstructed by such problems. Because of a great problem in the structure of the piezoelectric driven actuator, i.e., its structure which is thin in thickness and long, the piezoelectric driven actuator is warped largely by slight residual stress. Therefore, it is difficult to fabricate variable capacitance type capacitors so as to yield a constant capacitance or keep drive voltages of switches constant.

SUMMARY OF THE INVENTION

The present invention has been made in view of these circumstances, and an object thereof is to provide a piezoelectric driven MEMS device in which the influence of the warp caused by residual strain in the piezoelectric film or the like is held down and the displacement quantity of the piezoelectric drive can be controlled with high reproducibility and high precision.

A piezoelectric driven MEMS device according to a first aspect of the present invention includes: a substrate; a first actuator which has a first fixed end fixed at least at one end to the substrate, which includes a first lower electrode, a first piezoelectric film formed on the first lower electrode, and a first upper electrode formed on the first piezoelectric film, and which can be operated by applying voltages to the first lower electrode and the first upper electrode; a second actuator which has a second fixed end fixed at least at one end to the substrate, which is disposed in parallel with the first actuator, which includes a second lower electrode becoming the same layer as the first lower electrode, a second piezoelectric film formed on the second lower electrode so as to become the same layer as the first piezoelectric film, and a second upper electrode formed on the second piezoelectric film so as to become the same layer as the first upper electrode, and which can be operated by applying voltages to the second lower electrode and the second upper electrode; and an electric circuit element having a first action part connected to the first actuator and a second action part connected to the second actuator.

A piezoelectric driven MEMS device according to a second aspect of the present invention includes: a substrate; a first actuator which has a first fixed end fixed at least at one end to the substrate, which includes a first lower electrode, a first piezoelectric film formed on the first lower electrode, and a first upper electrode formed on the first piezoelectric film, and which can be operated by applying voltages to the first lower electrode and the first upper electrode; a second actuator which has a second fixed end fixed at least at one end to the substrate, which is disposed in parallel with the first actuator, which includes a second lower electrode becoming the same layer as the first lower electrode, a second piezoelectric film formed on the second lower electrode so as to become the same layer as the first piezoelectric film, and a second upper electrode formed on the second piezoelectric film so as to become the same layer as the first upper electrode, and which can be operated by applying voltages to the second lower electrode and the second upper electrode; a third actuator which has a third fixed end fixed at least at one end to the substrate, which is disposed across the first actuator from the second actuator and in parallel with the first actuator, which includes a third lower electrode becoming the same layer as the first lower electrode, a third piezoelectric film formed on the third lower electrode so as to become the same layer as the first piezoelectric film, and a third upper electrode formed on the third piezoelectric film so as to become the same layer as the first upper electrode, and which can be operated by applying voltages to the third lower electrode and the third upper electrode; and an electric circuit element having a first action part connected to the first actuator, a second action part connected to the second actuator, and a third action part connected to the third actuator.

A piezoelectric driven MEMS device according to a third aspect of the present invention includes: a substrate; a first actuator which has a first fixed end fixed at least at one end to the substrate, which includes a first lower electrode, a first lower piezoelectric film formed on the first lower electrode, a first intermediate electrode formed on the first lower piezoelectric film, a first intermediate electrode formed on the first lower piezoelectric film, a first upper piezoelectric film formed on the first intermediate electrode, and a first upper electrode formed on the first upper piezoelectric film, and which can be operated by applying voltages to the first intermediate electrode and at least one of the first lower electrode and the first upper electrode; a second actuator which has a second fixed end fixed at least at one end to the substrate, which is disposed in parallel with the first actuator, which includes a second lower electrode becoming the same layer as the first lower electrode, a second lower piezoelectric film formed on the second lower electrode so as to become the same layer as the first lower piezoelectric film, a second intermediate electrode formed on the second lower piezoelectric film so as to become the same layer as the first intermediate electrode, a second upper piezoelectric film formed on the second intermediate electrode so as to become the same layer as the first upper piezoelectric film, and a second upper electrode formed on the second upper piezoelectric film so as to become the same layer as the first upper electrode, and which can be operated by applying voltages to the second intermediate electrode and at least one of the second lower electrode and the second upper electrode; and an electric circuit element having a first action part connected to the first actuator and a second action part connected to the second actuator.

A piezoelectric driven MEMS device according to a fourth aspect of the present invention includes: a substrate; a first actuator which has a first fixed end fixed at least at one end to the substrate, which includes a first lower electrode, a first lower piezoelectric film formed on the first lower electrode, a first intermediate electrode formed on the first lower piezoelectric film, a first intermediate electrode formed on the first lower piezoelectric film, a first upper piezoelectric film formed on the first intermediate electrode, and a first upper electrode formed on the first upper piezoelectric film, and which can be operated by applying voltages to the first intermediate electrode and at least one of the first lower electrode and the first upper electrode; a second actuator which has a second fixed end fixed at least at one end to the substrate, which is disposed in parallel with the first actuator, which includes a second lower electrode becoming the same layer as the first lower electrode, a second lower piezoelectric film formed on the second lower electrode so as to become the same layer as the first lower piezoelectric film, a second intermediate electrode formed on the second lower piezoelectric film so as to become the same layer as the first intermediate electrode, a second upper piezoelectric film formed on the second intermediate electrode so as to become the same layer as the first upper piezoelectric film, and a second upper electrode formed on the second upper piezoelectric film so as to become the same layer as the first upper electrode, and which can be operated by applying voltages to the second intermediate electrode and at least one of the second lower electrode and the second upper electrode; a third actuator which has a third fixed end fixed at least at one end to the substrate, which is disposed across the first actuator from the second actuator and in parallel with the first actuator, which includes a third lower electrode becoming the same layer as the first lower electrode, a third lower piezoelectric film formed on the third lower electrode so as to become the same layer as the first lower piezoelectric film, a third intermediate electrode formed on the third lower piezoelectric film so as to become the same layer as the first intermediate electrode, a third upper piezoelectric film formed on the third intermediate electrode so as to become the same layer as the first upper piezoelectric film, and a third upper electrode formed on the third upper piezoelectric film so as to become the same layer as the first upper electrode, and which can be operated by applying voltages to the third intermediate electrode and at least one of the third lower electrode and the third upper electrode; and an electric circuit element having a first action part connected to the first actuator, a second action part connected to the second actuator, and a third action part connected to the third actuator.

BRIEF DESCRIPTION OF THE DRAWINGS

FIGS. 14A and 14B are diagrams showing amplifier matching circuits according to a ninth embodiment.

DETAILED DESCRIPTION OF THE INVENTION

First, before describing the embodiments of the present invention, the course of events for achieving the present invention will be described below.

The present inventors have repeated considerations concerning the movable range in the piezoelectric driven MEMS device and magnitude of the warp which is caused by imbalance of residual stress and which exerts the greatest influence upon the operation. On the basis of its result, a new idea for overcoming the warp occurred to the present inventors.

Figure 3:
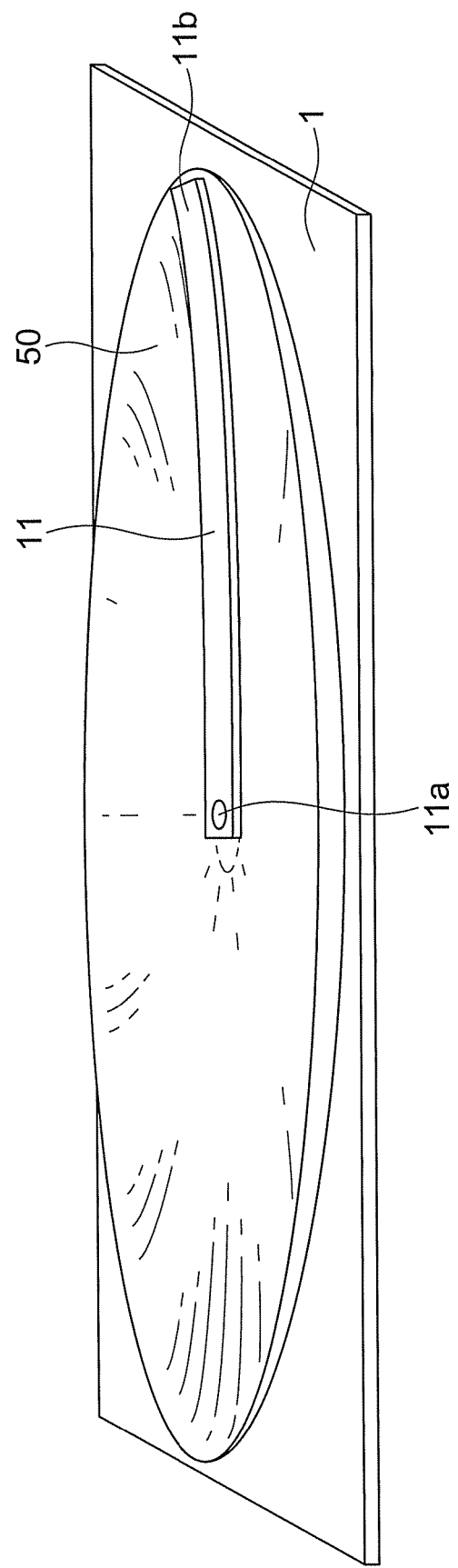
FIG. 3 is a diagram schematically showing a warp of a piezoelectric driven actuator.

As for the problem to be solved, the warp quantity of the piezoelectric driven MEMS device is proportionate to square of the length of the actuator as already described in detail. Three-dimensionally, a piezoelectric driven MEMS device 11 warps so as to take the shape of a radial face 50 around an end 11a fixed to a substrate 1 as shown in FIG. 3.

Figure 4:
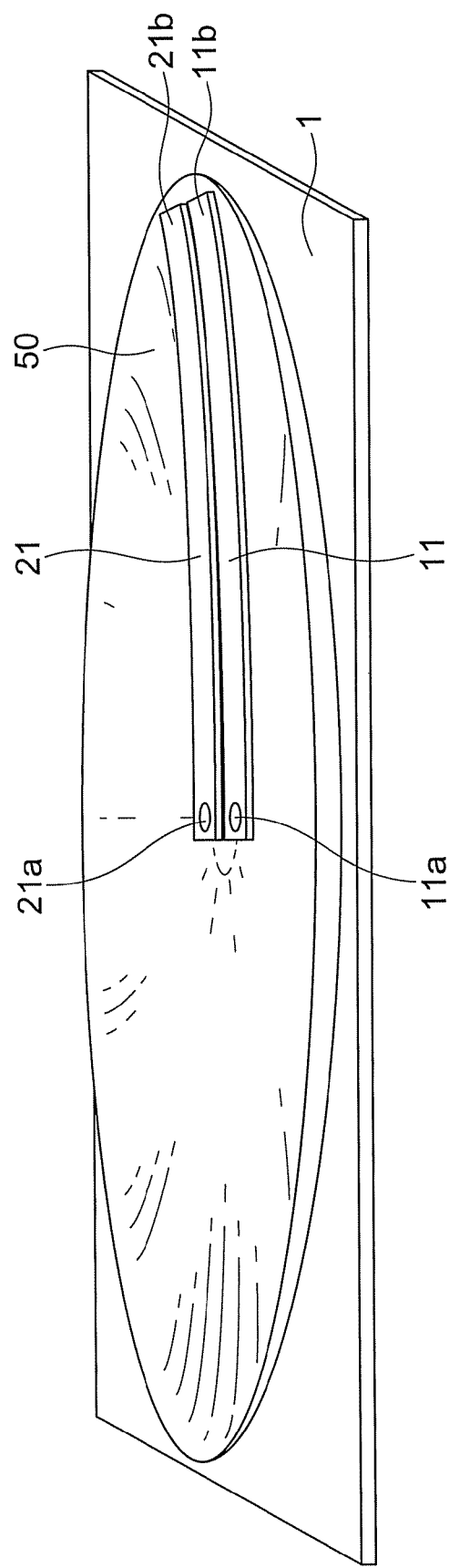
FIG. 4 is a diagram schematically showing warps obtained when two neighboring actuators are fabricated under the same condition.

Therefore, the present inventors have thought of fabricating first and second piezoelectric driven MEMS devices 11 and 21 under the same condition and disposing them side by side as schematically shown in FIG. 4. By using such a configuration, warp quantities of the actuators 11 and 21 become nearly the same along the radial face 50. And by providing action parts 11b and 21b at the same distance respectively from fixed ends 11a and 21a, displacement quantities caused at the action parts 11b and 21b by warps become equal to each other and the influence of the warps is held down.

Hereafter, embodiments of the present invention will be described in detail with reference to the drawings. In the ensuing description of the drawings, the same or similar parts are denoted by like or similar reference numerals.

First Embodiment

Figure 1:
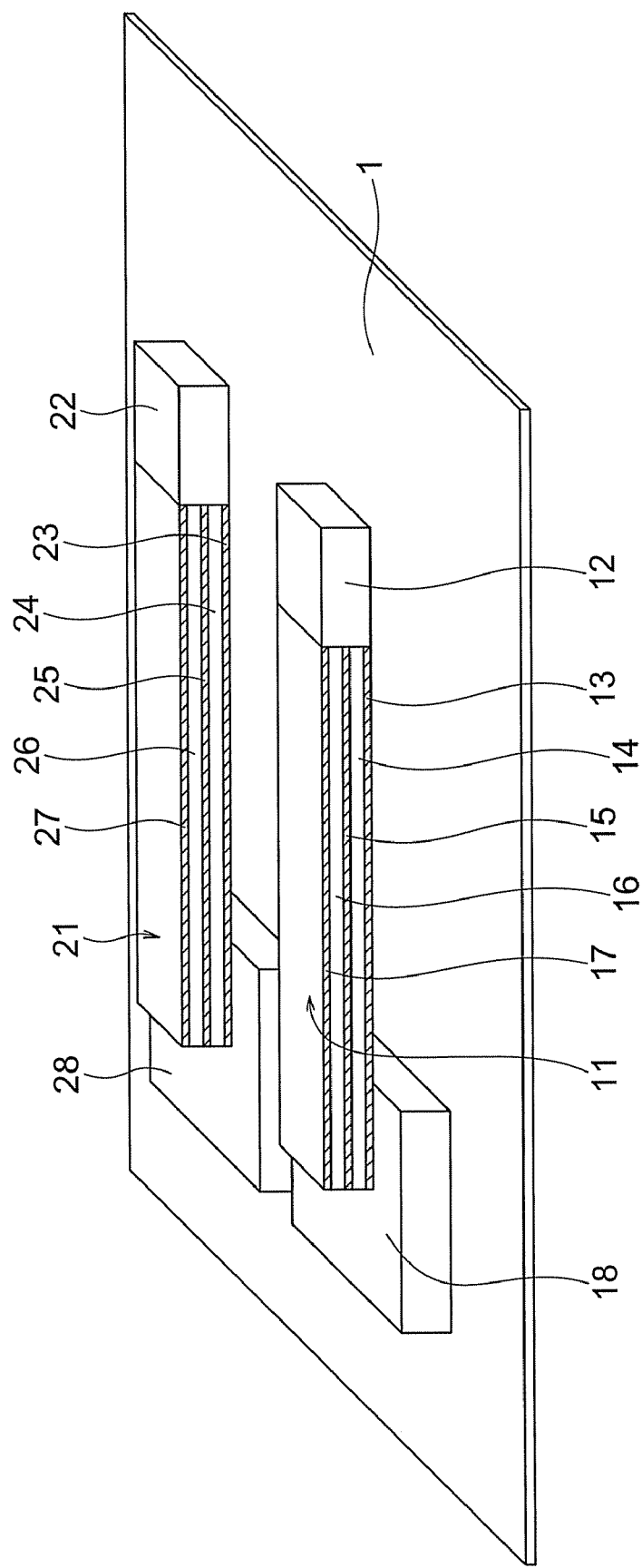
FIG. 1 is a perspective view showing a piezoelectric driven MEMS device according to a first embodiment.

A piezoelectric driven MEMS device according to a first embodiment of the present invention is shown in FIG. 1. The piezoelectric driven MEMS device according to the present embodiment includes a first actuator 11 and a second actuator 21. A first end of the first actuator is a fixed end, and it is fixed to a substrate 1 through an anchor 18. The first actuator 11 includes a lower electrode 13, a piezoelectric film 14, an intermediate electrode 15, a piezoelectric film 16 and an upper electrode 17. The first actuator 11 is a piezoelectric driven actuator having the so-called bimorph structure. An action part 12 is connected to a second part of the first actuator 11.

The second actuator 21 is formed with the same stacked structure as that of the first actuator 11, under the same fabrication condition as that of the first actuator 11, or concurrently with the first actuator 11. A first end of the first actuator is a fixed end, and it is fixed to the substrate 1 through an anchor 28. The second actuator 21 includes a lower electrode 23, a piezoelectric film 24, an intermediate electrode 25, a piezoelectric film 26 and an upper electrode 27. The lower electrode 23, the piezoelectric film 24, the intermediate electrode 25, the piezoelectric film 26 and the upper electrode 27 in the second actuator 21 are formed so as to become the same layers respectively as the lower electrode 13, the piezoelectric film 14, the intermediate electrode 15, the piezoelectric film 16 and the upper electrode 17 do.

An action part 22 is connected to a second part of the second actuator 21. A fixed end of the second actuator 21 is positioned on a straight line that passes through the fixed end of the first actuator 11 and that is perpendicular to a direction in which the first actuator 11 extends. The distance between the fixed end of the first actuator 11 and the position where the action part 12 is connected is substantially equal to the distance between the fixed end of the second actuator 21 and the position where the action part 12 is connected.

Even if residual strain that is vertically asymmetrical arises in piezoelectric films or electrodes included in the first actuator 11 and the second actuator 21, therefore, the warp quantities in the first actuator 11 and the second actuator 21 become substantially equal to each other. As a result, it becomes possible to hold down the difference in displacement caused between the action part 12 and the action part 22 by the warps to a very small value.

Figure 2:
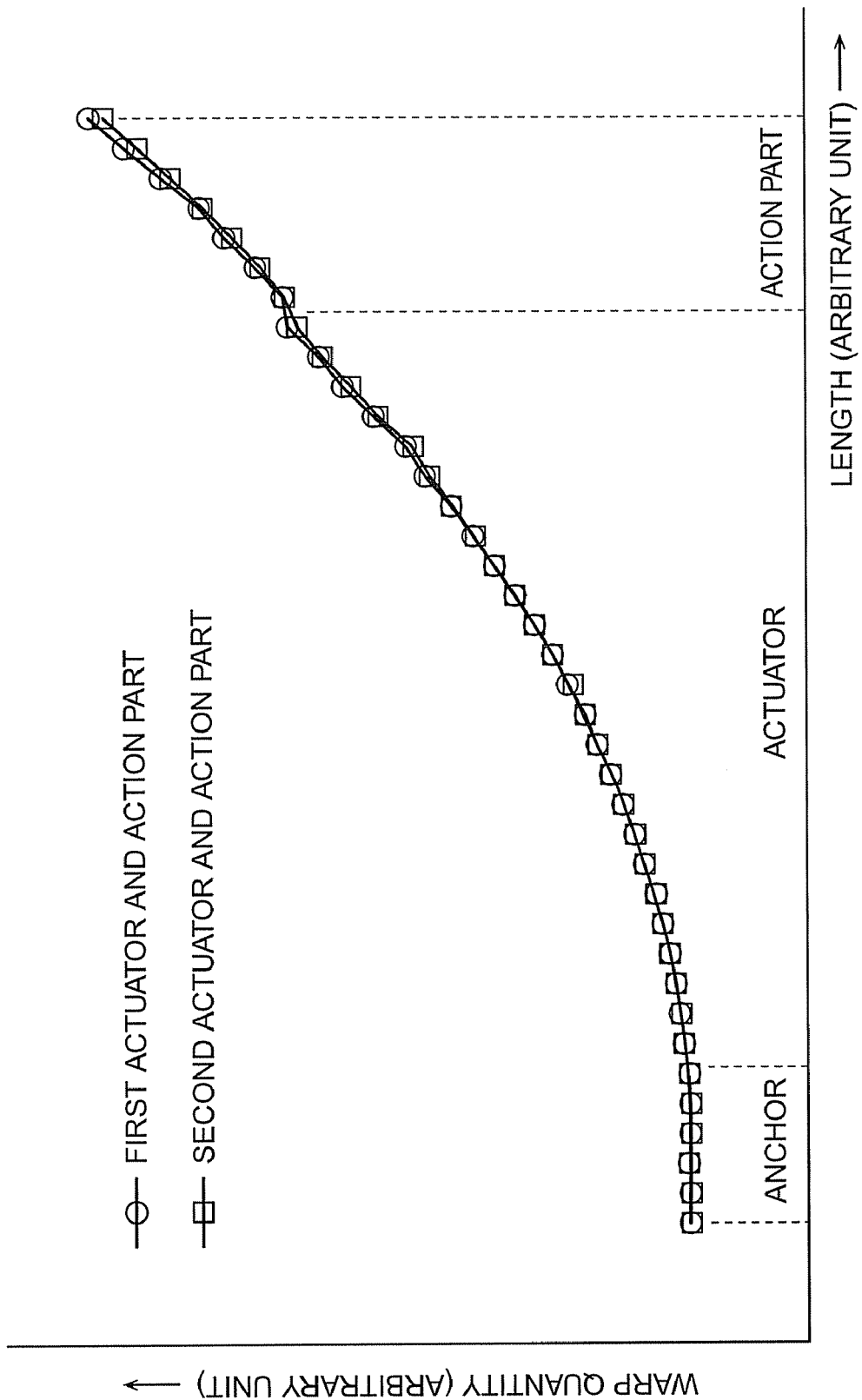
FIG. 2 is a diagram showing a result obtained by observing a warp of the piezoelectric driven MEMS device according to the first embodiment.

FIG. 2 shows a result obtained by observing the warp in the second actuator 21 which is formed with the same stacked structure and under the same fabrication condition as the first actuator 11, by using a confocal laser microscope. The abscissa in FIG. 2 indicates a length between the anchor of each actuator and an arbitrary point in the action part direction, and the ordinate indicates the warp quantity at that point. As apparent from FIG. 2, the warp quantity in the first actuator 11 is substantially equal to that in the second actuator 21. It is appreciated that the difference in displacement caused between the action part 12 connected to the first actuator 11 and the action part 22 connected to the second actuator 21 by the warps is held down to a very small value.

Figure 6:
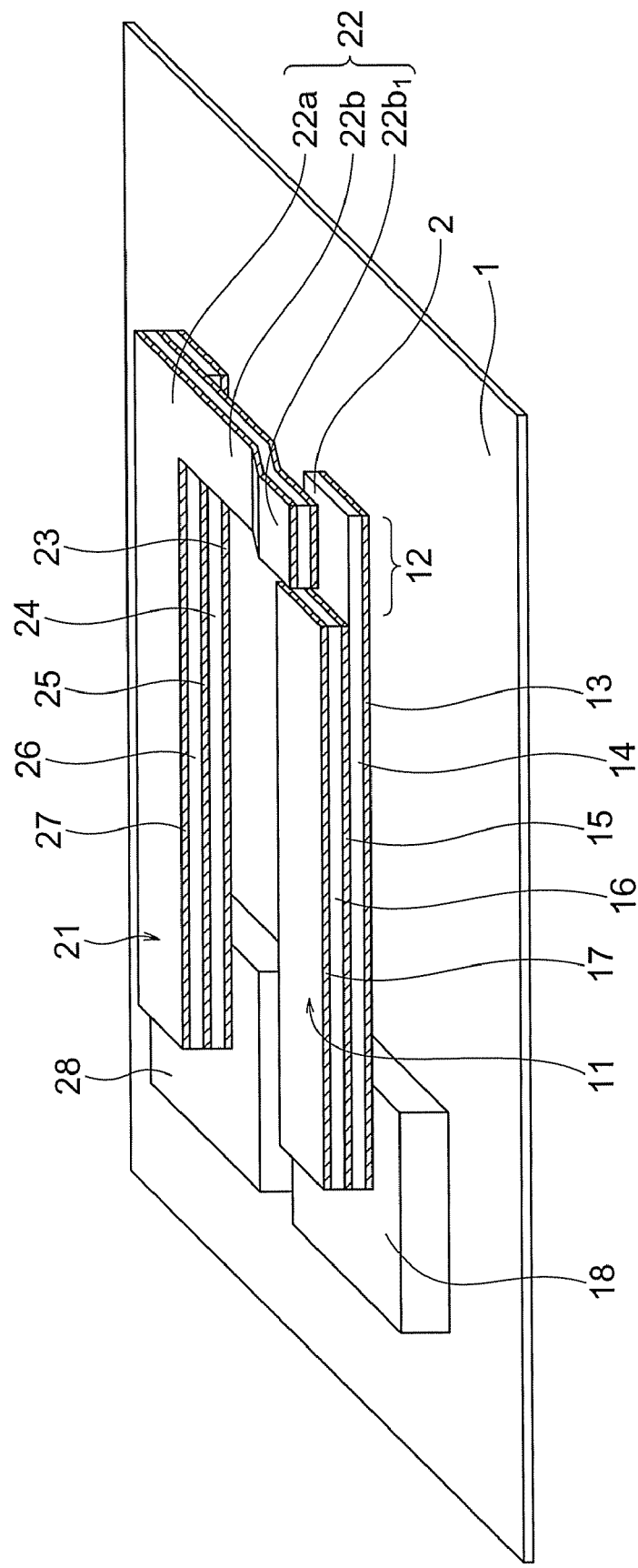
FIG. 6 is a perspective view showing a piezoelectric driven MEMS device according to a third embodiment.
Figure 7:
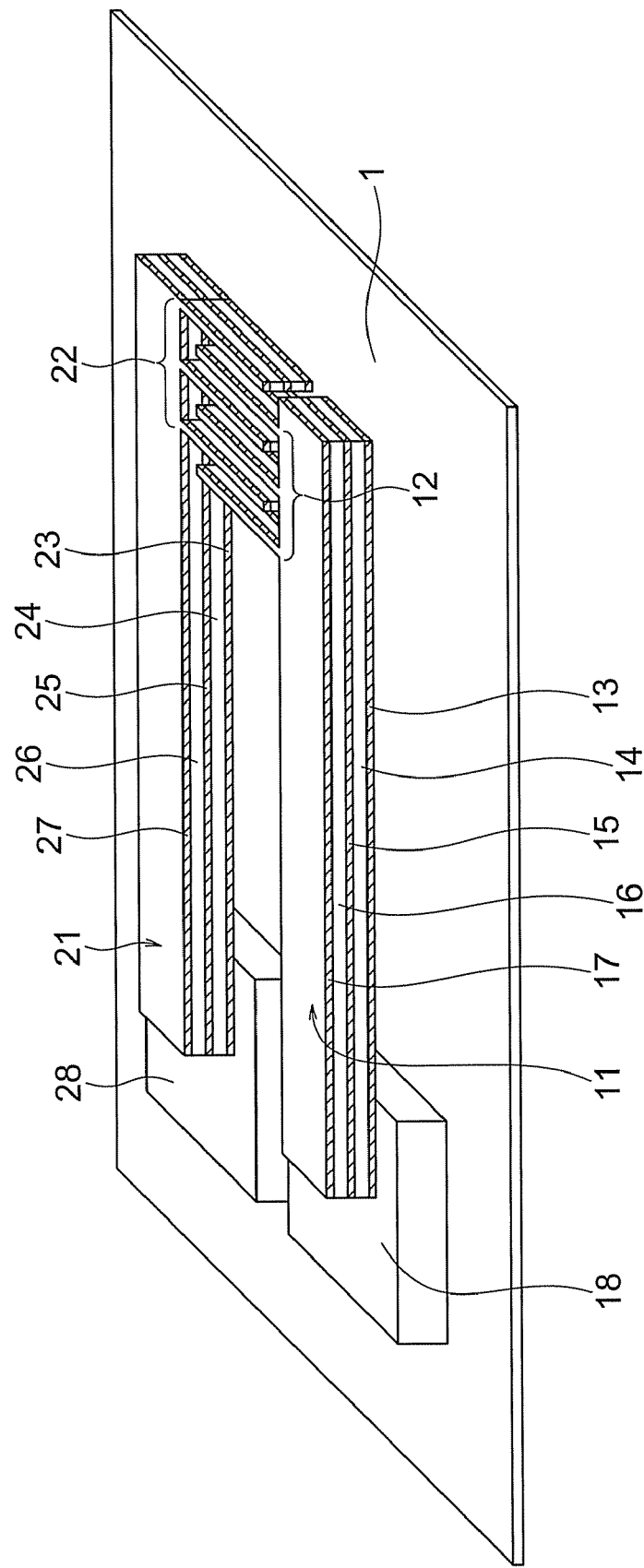
FIG. 7 is a perspective view showing a piezoelectric driven MEMS device according to a fourth embodiment.

If electrodes or contacts are provided in the action parts 12 and 22 in the present embodiment to form capacitor structures or contact structures, for example, as shown in FIGS. 6 and 7 which will be described later, then it is possible to obtain a variable capacitance type capacitor or a switch in which the displacement quantity can be controlled with high reproducibility and at high precision.

As heretofore described, it is possible according to the present embodiment to obtain a piezoelectric driven MEMS device in which the displacement quantity of the piezoelectric drive can be controlled with high reproducibility and at high precision by holding down the difference in displacement caused by the warp which is in turn caused by residual strain in the piezoelectric film or the like.

Second Embodiment

Figure 5:
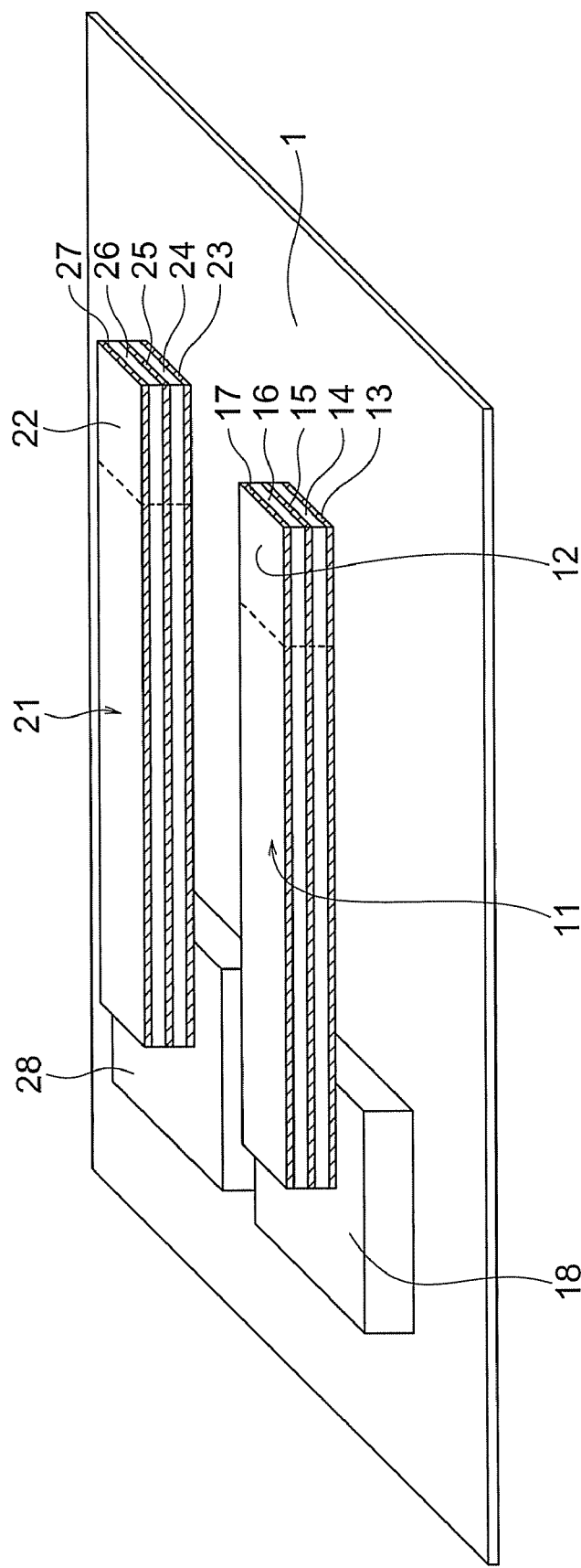
FIG. 5 is a perspective view showing a piezoelectric driven MEMS device according to a second embodiment.

A piezoelectric driven MEMS device according to a second embodiment of the present invention is shown in FIG. 5. The piezoelectric driven MEMS device according to the present embodiment has a configuration in which the action part 12 in the first embodiment is formed of the lower electrode 13, the piezoelectric film 14, the intermediate electrode 15, the piezoelectric film 16 and the upper electrode 17 in the same way as the first actuator 11 and the action part 22 is formed of the lower electrode 23, the piezoelectric film 24, the intermediate electrode 25, the piezoelectric film 26 and the upper electrode 27 in the same way as the second actuator 21.

Fabricating the action parts 12 and 22 by using the materials used to form the actuators brings about an advantage that it becomes easy to hold down the displacements due to residual strains caused in the action parts, between the action parts and the actuators and the action parts can be formed simultaneously.

It is a matter of course that each action part may be formed of all of the piezoelectric film, the upper electrode and the lower electrode, which are included in the actuator, or each action part may be formed of a part of them.

It is a matter of course that the action part 12 may be formed of all of the materials forming the second actuator 21 or a part of them and the action part 22 may be formed of all of the materials forming the first actuator 11 or a part of them.

In the present embodiment as well, it is possible to obtain a piezoelectric driven MEMS device in which the displacement quantity of the piezoelectric drive can be controlled with high reproducibility and at high precision by holding down the difference in displacement caused by the warp which is in turn caused by residual strain, in the same way as the first embodiment.

Third Embodiment

A piezoelectric driven MEMS device according to a third embodiment of the present invention is shown in FIG. 6. The piezoelectric driven MEMS device according to the present embodiment has a configuration in which the action part 12 and the action part 22 in the first embodiment form a parallel plate capacitor to fabricate a variable capacitor.

The action part 12 is formed of the lower electrode 13 and the piezoelectric film 14, which are included in the first actuator 11. The action part 22 includes a main body part 22a, and an extension part 22b which is connected to the main body part 22a and which extends in a direction substantially perpendicular to the extension direction of the second actuator 21. In the same way as the second actuator 21, the main body part 22a includes the lower electrode 23, the piezoelectric film 24, the intermediate electrode 25, the piezoelectric film 26 and the upper electrode 27. The extension part 22b includes the intermediate electrode 25, the piezoelectric film 26 and the upper electrode 27, which are included in the second actuator 21. A tip part $22b_1$ of the extension part $22b$ is formed so as to overlap at least a part of the action part 12 when seen from the above and have a gap 2 between the action part 12 and the tip part $22b_1$. Therefore, the tip part $22b_1$ is formed so as to be raised as compared with a part of the extension part 22b except the tip part $22b_1$ and kept away from the substrate 1. In this way, a parallel plate capacitor is formed by providing the gap 2 between the tip part $22b_1$ and the action part 12. The gap 2 can be formed by depositing a sacrifice layer which is not illustrated on the piezoelectric film 14 of the action part 12, subsequently forming the action part 22, and removing the sacrifice layer.

The spacing of the gap 2 is changed by driving one or both of the first actuator 11 and the second actuator 21. As a result, the capacitance of the parallel plate capacitor is changed. It thus becomes possible to make the parallel plate capacitor function as a variable capacitor. By forming such a parallel plate capacitor, a capacitor having a comparatively large capacitance can be fabricated.

If a voltage in the range of 0 V to 3 V is applied between the lower electrode 13 and the intermediate electrode 15 and between the upper electrode 17 and the intermediate electrode 15 in the first actuator and a voltage in the range of 0 V to 3 V is applied between the intermediate electrode 25 and the lower electrode 23 and between the intermediate electrode 25 and the upper electrode 27 in the second actuator, then the first actuator 11 displaces upward as compared with the substrate 1 and the second actuator 21 displaces downward as the applied voltage increases. Finally, at the applied voltage of 3 V, the action part 11 comes in contact with the tip part $22b_1$ of the action part 22. Namely, the lower electrode 13 in the action part 12 comes in contact with the intermediate electrode 25 of the tip part $22b_1$ in the action part 22 via the piezoelectric film 14 in the action part 12. As a result, the parallel plate capacitor formed of the action part 12 and the tip part $22b_1$ of the action part 22b changes very largely in capacitance from 0.11 pF to 5.33 pF.

The above-described parallel plate capacitor is fabricated by using materials used for the first actuator 11 and the second actuator 21. Even if the parallel plate capacitor is fabricated by using other materials, however, no problems are posed.

By using a configuration similar to the above-described configuration, impedance for an AC signal becomes high when the capacitance of the parallel plate capacitor is small, whereas the impedance becomes low when the capacitance is large. It is also possible to form a capacitive switch which functions as a switch for an AC signal, by utilizing such a property.

What is to be attended to when using the piezoelectric driven MEMS device according to the present embodiment will now be described. In each of the first actuator 11 and the second actuator 21, a signal which passes through the variable capacitor is also present besides a drive signal for driving the actuator. Therefore, it is necessary to separate the signal which passes through the variable capacitor, by using some means such as a bias T.

Fourth Embodiment

A piezoelectric driven MEMS device according to a fourth embodiment of the present invention is shown in FIG. 7. The piezoelectric driven MEMS device according to the present embodiment has a configuration obtained from the second embodiment shown in FIG. 5 by providing the action part 12 on the side part of the first actuator 11 so as to direct the action part 12 toward the second actuator 21 and providing the action part 22 on the side part of the second actuator 21 so as to direct the action part 22 toward the first actuator 11. Each of the action part 12 and the action part 22 takes the shape of teeth of a comb when seen from the above. The action part 12 and the action part 22 are arranged so as to cause comb teeth of the action part 12 to alternate with those of the action part 22. In the present embodiment, therefore, the action part 12 and the action part 22 form a variable capacitor which takes the shape of comb teeth. Capacitances of the capacitor are generated between the lower electrode and the intermediate electrode and between the intermediate electrode and the upper electrode in each action part.

In the present embodiment, the action part 12 is made by using absolutely the same material as that of the first actuator 11, and the action part 22 is made by using absolutely the same material as that of the second actuator 21.

The overlap quantity between the lower electrode and the intermediate electrode and the overlap quantity between the intermediate electrode and the upper electrode in each of the action part 12 and the action part 22 are changed by driving one or both of the first actuator 11 and the second actuator 21. As a result, the capacitance of the capacitor taking the shape of comb teeth is changed. It thus becomes possible to make the first actuator 11 and the second actuator 21 function as a variable capacitor. It becomes unnecessary to fabricate capacitor forming electrodes at right angles to the substrate by forming such a comb tooth capacitor. As compared with the parallel plate capacitor, therefore, there is an advantage that the fabrication is highly facilitated.

If a voltage in the range of 0 V to 3 V is applied between the lower electrode 13 and the intermediate electrode 15 and between the upper electrode 17 and the intermediate electrode 15 in the first actuator and a voltage in the range of 0 V to 3 V is applied between the intermediate electrode 25 and the lower electrode 23 and between the intermediate electrode 25 and the upper electrode 27 in the second actuator, then the first actuator 11 displaces upward as compared with the substrate 1 and the second actuator 21 displaces downward as the applied voltage increases. As a result, the comb tooth capacitor formed of the action part 12 and the action part 22 changes in capacitance from 0.32 pF to 0.08 pF.

The above-described comb tooth capacitor is fabricated by using absolutely the same materials used for the first actuator 11 and the second actuator 21. Even if the comb tooth capacitor is fabricated by using the same material only for a part, however, no problems are posed. Even if the comb tooth capacitor is fabricated by using materials other than the materials forming the first actuator 11 and the second actuator 21, there are no problems at all.

It is also possible to form a capacitive switch which functions as a switch for an AC signal, by using a configuration similar to the above-described configuration.

What is to be attended to when using the piezoelectric driven MEMS device according to the present embodiment will now be described. In each of the first actuator 11 and the second actuator 21, a signal which passes through the variable capacitor is also present besides a drive signal for driving the actuator. Therefore, it is necessary to separate the signal which passes through the variable capacitor, by using some means such as a bias T.

Fifth Embodiment

Figure 8:
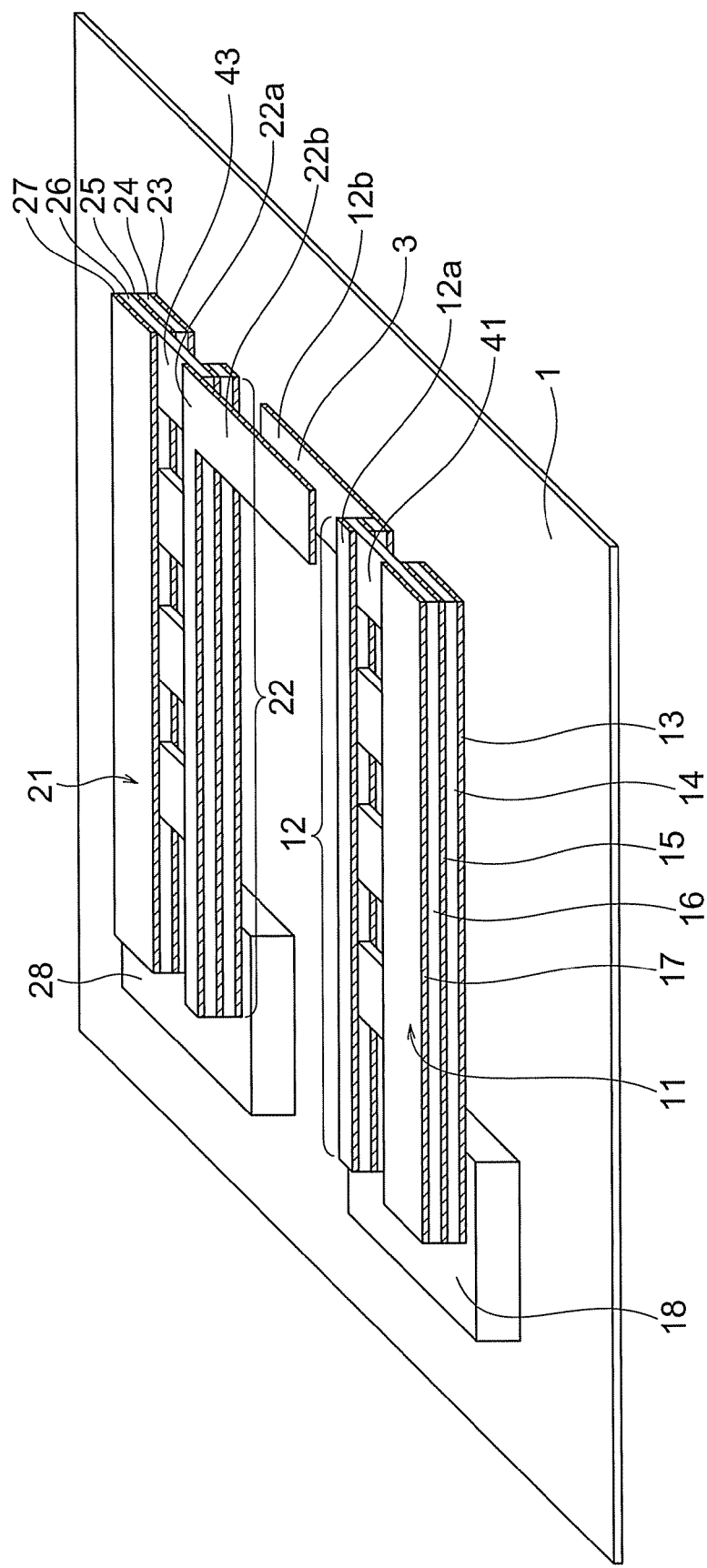
FIG. 8 is a perspective view showing a piezoelectric driven MEMS device according to a fifth embodiment.

A piezoelectric driven MEMS device according to a fifth embodiment of the present invention is shown in FIG. 8. In the piezoelectric driven MEMS device according to the present embodiment, an electric contact is formed by using the action part 12 and the action part 22 in the first embodiment to form a switch.

The action part 12 includes a main body part 12a and an extension part 12b connected to the main body part 12a. The main body part 12a is provided on the side part of the first actuator 11 adjacent to the second actuator 21, along the first actuator 11. The main body part 12a is fixed at a first end to the substrate 1 via an anchor 18. The extension part 12b is provided at a second end of the main body part 12a so as to extend toward the second actuator 21 at substantially right angles to the main part 12a. The main body part 12a has absolutely the same configuration as the first actuator 11 does. In other words, the main body part 12a includes the lower electrode 13, the piezoelectric film 14, the intermediate electrode 15, the piezoelectric film 16 and the upper electrode 17. The extension part 12b is formed of the lower electrode 13. The action part 12 is connected to the first actuator 11 by a plurality of connection parts 41 which are the same layer as the piezoelectric film 16 and which are formed of the same material as that of the piezoelectric film 16.

The action part 22 includes a main body part 22a and an extension part 22b connected to the main body part 22a. The main body part 22a is provided on the side part of the second actuator 21 adjacent to the first actuator 11, along the second actuator 21. The main body part 22a is fixed at a first end to the substrate 1 via an anchor 28. The extension part 22b is provided at a second end of the main body part 22a so as to extend toward the first actuator 11 at substantially right angles to the main part 22a. The main body part 22a has absolutely the same configuration as the second actuator 21 does. In other words, the main body part 22a includes the lower electrode 23, the piezoelectric film 24, the intermediate electrode 25, the piezoelectric film 26 and the upper electrode 27. The extension part 22b is formed of the upper electrode 27. The action part 22 is connected to the second actuator 21 by a plurality of connection parts 43 which are the same layer as the piezoelectric film 26 and which are formed of the same material as that of the piezoelectric film 26.

The extension part 12b of the action part 12 and the extension part 22b of the action part 22 are configured so as to partially overlap via a gap 3. In the same way as the third embodiment, the gap 3 is formed by depositing a sacrifice layer which is not illustrated on the extension part 12b of the action part 12, subsequently forming the extension part 22b of the action part 22, and then removing the sacrifice layer. The first actuator 11 is electrically insulated from the action part 12, and the second actuator 21 is electrically insulated from the action part 22.

The extension part 12b formed of the lower electrode 13 and the extension part 22b formed of the upper electrode 27 are formed so as to overlap each other via the gap 3. This overlap part forms an electric contact. If the size of the gap 3, i.e., the distance between the extension part 12b and the extension part 22b is not zero, then the extension part 12b of the action part 12 is electrically insulated from the extension part 22b of the action part 22, resulting in an off-state of the switch. If one or both of the first actuator 11 and the second actuator 21 is driven and the size of the gap 3 has finally become zero, then electric conduction between the extension part 12b of the action part 12 and the extension part 22b of the action part 22 is achieved, resulting in an on-state of the switch.

It is possible to make the area of electrodes forming the contact comparatively large by fabricating such an electric contact. As a result, it is advantageous to reduction of the contact resistance.

If a voltage in the range of 0 V to 5 V is applied between the lower electrode 13 and the intermediate electrode 15 and between the upper electrode 17 and the intermediate electrode 15 in the first actuator 11 and a voltage in the range of 0 V to 5 V is applied between the intermediate electrode 25 and the lower electrode 23 and between the intermediate electrode 25 and the upper electrode 27 in the second actuator 21, then the first actuator 11 displaces upward as compared with the substrate 1 and the second actuator 21 displaces downward as the applied voltage increases. When the applied voltage is in the range of 0 to 3.3 V, the switch between the lower electrode 13 in the first action part 12 and the upper electrode 27 in the second action part 22 comes in the off-state. When the applied voltage is in the range of 3.3 V to 5 V, the switch between the lower electrode 13 in the first action part 12 and the upper electrode 27 in the second action part 22 comes in the on-state. In the present embodiment, the drive voltage of the switch can be kept constant.

Although the switch is fabricated by using the materials which form the first actuator 11 and the second actuator 21, there are no problems at all even if other materials are used.

Sixth Embodiment

Figure 9:
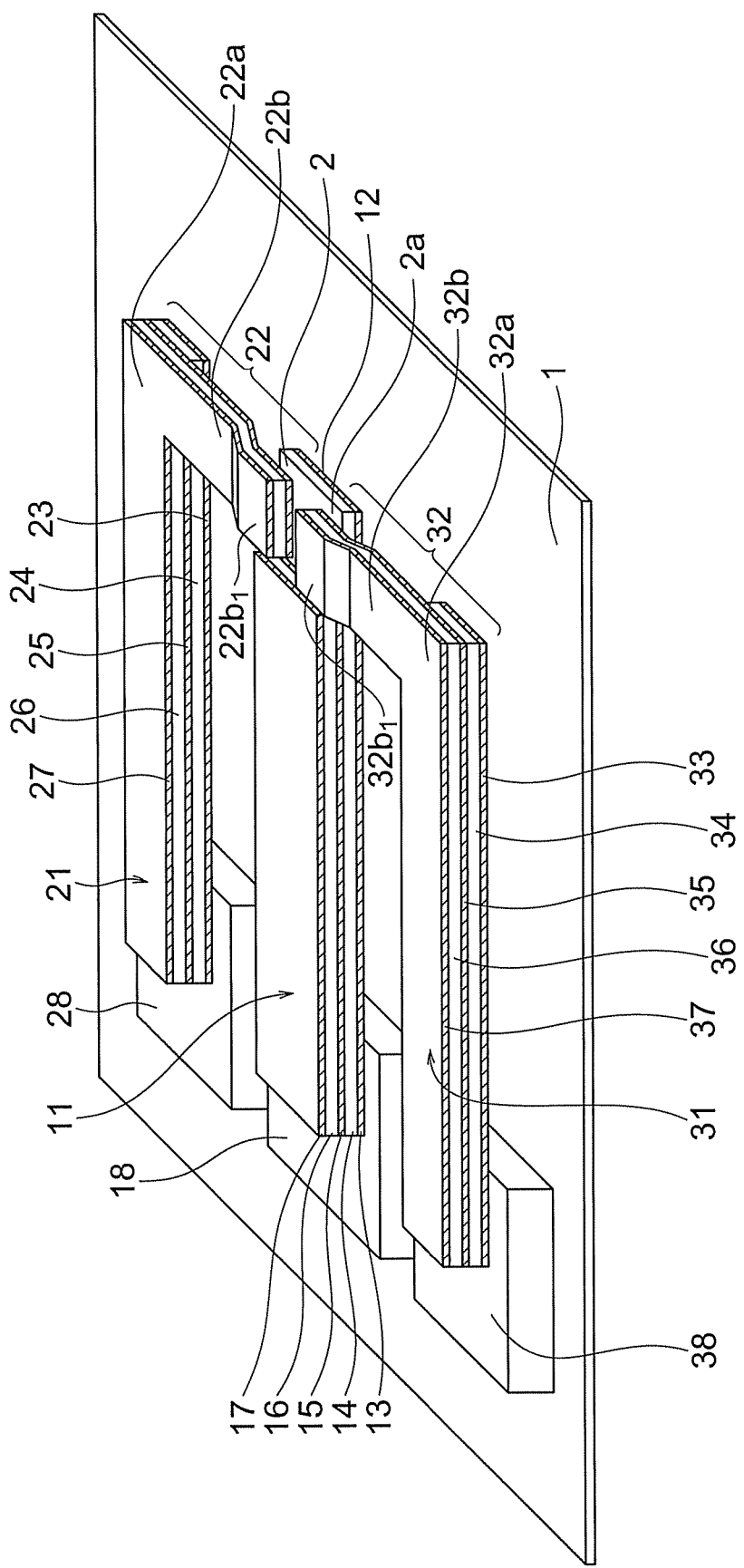
FIG. 9 is a perspective view showing a piezoelectric driven MEMS device according to a sixth embodiment.

A piezoelectric driven MEMS device according to a sixth embodiment of the present invention is shown in FIG. 9. The piezoelectric driven MEMS device according to the present embodiment has a configuration obtained from the third embodiment shown in FIG. 6 by providing a third actuator 31 across the first actuator 11 from the second actuator 21. In other words, the piezoelectric driven MEMS device according to the third embodiment is a variable capacitor having two actuators 11 and 21, whereas in the present embodiment three actuators 11, 21 and 31 form a variable capacitor.

The third actuator 31 is fixed at its first end to an anchor 38 provided on the substrate 1. An action part 32 is connected to a second end of the third actuator 31. The third actuator 31 includes a lower electrode 33, a piezoelectric film 34, an intermediate electrode 35, a piezoelectric film 36 and an upper electrode 37. The third actuator 31 has the so-called bimorph structure. The first to third actuators 11, 21 and 31 are formed with the same stacked structure, under the same fabrication condition, or concurrently.

In the same way as the action part 22 described with reference to the second embodiment, the action part 32 includes a main body part 32a, and an extension part 32b which is connected to the main body part 32a and which extends in a direction substantially perpendicular to the extension direction of the third actuator 31. In the same way as the third actuator 31, the main body part 32a includes the lower electrode 33, the piezoelectric film 34, the intermediate electrode 35, the piezoelectric film 36 and the upper electrode 37. The extension part 32b includes the intermediate electrode 35, the piezoelectric film 36 and the upper electrode 37, which are included in the third actuator 31. A tip part $32b_1$ of the extension part 32b is formed so as to overlap a part of the action part 12 when seen from the above and have a gap 2a between the tip part $32b_1$ and the action part 12. Therefore, the tip part $32b_1$ is formed so as to be raised as compared with a part of the extension part 32b except the tip part $32b_1$, and kept away from the substrate 1. In this way, parallel plate capacitors are formed by providing the gap 2 between the tip part $22b_1$ of the action part 22 and the action part 12 and providing the gap 2a between the tip part $32b_1$ of the action part 32 and the action part 12. The gap 2a can be formed in the same way as in the description of the third embodiment.

Figure 10:
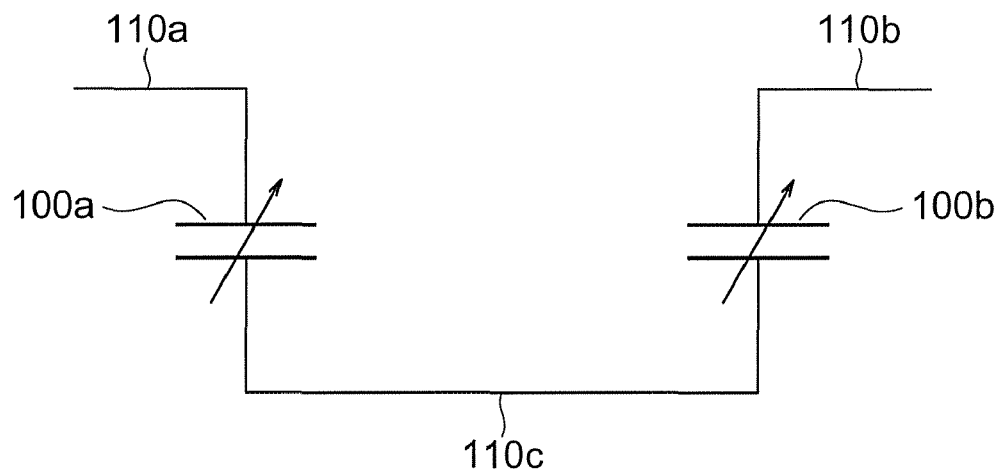
FIG. 10 is an equivalent circuit diagram of variable capacitor parts of a piezoelectric driven MEMS device according to the sixth embodiment.

The spacing of the gap 2 or 2a is changed by driving at least one of the first to third actuators 11, 21 and 31. As a result, capacitances of the parallel plate capacitors are changed. In the same way as the third embodiment, the parallel plate capacitors function as variable capacitors. As for a signal passing through these parallel plate capacitors, however, the signal is passed through, for example, a parallel plate capacitor formed of the action part 22 and the action part 12, and then passed through a parallel plate capacitor formed of the action part 12 and the action part 32, again. In other words, the equivalent circuit is shown in FIG. 10. In FIG. 10, for example, a variable capacitor 100a is a parallel plate capacitor formed of the action part 22 and the action part 12, and a variable capacitor 100b is a parallel plate capacitor formed of the action part 12 and the action part 32. A line 110a corresponds to the intermediate electrode 25 in the action part 22, a line 110b corresponds to the intermediate electrode 35 in the action part 32, and a line 110c corresponds to the lower electrode 13 in the action part 12.

In the case where only the first actuator 11 is driven for a capacitance change and a drive voltage is not applied to the second actuator 21 and the third actuator 31, only the signal that has been passed through the capacitor flows through the actuators 21 and 31. This brings about an advantage that it is not necessary to use means that separates the drive signal for driving the actuator from the signal passing through the variable capacitor.

In the same way as the fifth embodiment, the MEMS device can be used as a switch by forming the action part 12 of only the lower electrode 13, forming the extension part 22b in the action part 22 of only the upper electrode 27, and forming the extension part 32b in the action part 32 of only the upper electrode 37.

In the piezoelectric driven MEMS device in the present embodiment shown in FIG. 9, a composite capacitance of two parallel plate capacitors connected in series has changed from 0.04 pF to 2.4 pF by driving the first actuator 11 with a voltage in the range of 0 V to 3 V.

The piezoelectric driven MEMS device in the present embodiment can also be used as a capacitive switch which functions as a switch for an AC signal.

Although the parallel plate capacitors are fabricated by using materials used to form the first actuator 11 and the second actuator 12, there are no problems even if they are fabricated by using other materials.

As for the operation of the piezoelectric driven MEMS devices according to the first to sixth embodiments, gaps between actuators may be changed by, for example, applying a voltage between the upper electrode and the lower electrode and applying a voltage opposite to that of the first actuator or a voltage different from that of the first actuator. Or there is an operation method in which only the first actuator is driven and the second actuator is not driven, or an operation method in which only the second actuator is driven and the first actuator is not driven.

As for each of the piezoelectric driven actuators, not only a uniform structure sandwiched between the upper and lower electrodes, but also a piezoelectric driven actuator of the so-called S mode in which the polarity of the upper and lower electrodes is inverted in the middle of the actuator.

As for each of the piezoelectric driven actuators, not only the so-called cantilever structure fixed at one end, but also the so-called doubly-clamped-beam structure fixed at both ends can be used.

As for the movable actuator mechanism having the piezoelectric driven mechanism, it is possible to use a structure called unimorph structure or asymmetric bimorph structure and obtained by laminating a piezoelectric film and a support film sandwiched between an upper electrode and a lower electrode, or a structure called bimorph structure and obtained by piling up two layers of piezoelectric film sandwiched between the upper electrode and the lower electrode.

As for the material of the piezoelectric film used in the piezoelectric driven part, wurtzite crystal such as aluminum nitride (AlN) or zinc oxide (ZnO) is stable and desirable. It is also possible to use a perovskite ferroelectric material such as lead zirconate titanate (PZT) or barium titanate (BTO).

As for the material of the upper electrode and the lower electrode used in the piezoelectric driven part, it is desirable to use a low-resistance metal such as aluminum (Al), gold (Au), platinum (Pt), copper (Cu), iridium (Ir), tungsten (W), or molybdenum (Mo) because of the resistivity and easiness in fabricating a thin film.

As for the material used in the action part, it is desirable to use the same material as that of the piezoelectric film, the upper electrode or the lower electrode, or a material typically used in the semiconductor process.

Seventh Embodiment

Figure 11:
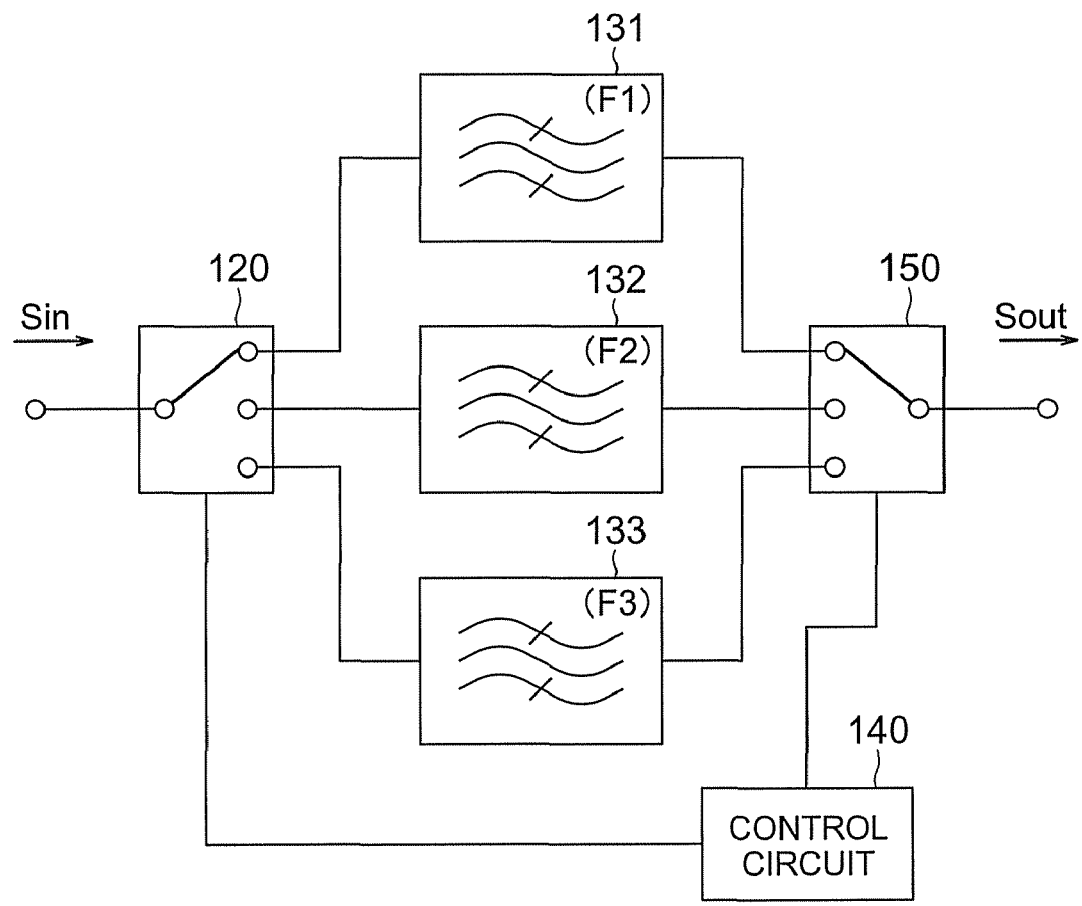
FIG. 11 is a circuit diagram showing a frequency band selection circuit in a mobile communication device according to a seventh embodiment.
Figure 12A:
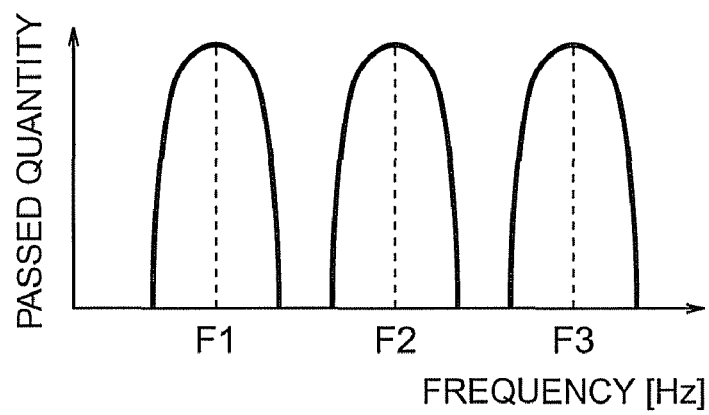
FIGS. 12A to 12C are waveform diagrams for explaining operation of the frequency selection circuit in the seventh embodiment.

A mobile communication device according to a seventh embodiment of the present invention will now be described with reference to FIG. 11 to FIG. 12C.

In general, the mobile communication device includes a frequency selection circuit which selects a frequency band, because the mobile communication device handles a plurality of frequency bands. FIG. 11 is a circuit diagram showing a frequency band selection circuit in a mobile communication device according to the present embodiment. The frequency band selection circuit includes a switch 120, band pass filters 131, 132 and 133, a control circuit 140, and a switch 150. As the switches 120 and 150, the piezoelectric driven MEMS device described with reference to the embodiments is used. As shown in FIG. 12A, the band pass filters 131, 132 and 133 pass frequencies in bands having center frequencies F1, F2 and F3, respectively.

Figure 12B:
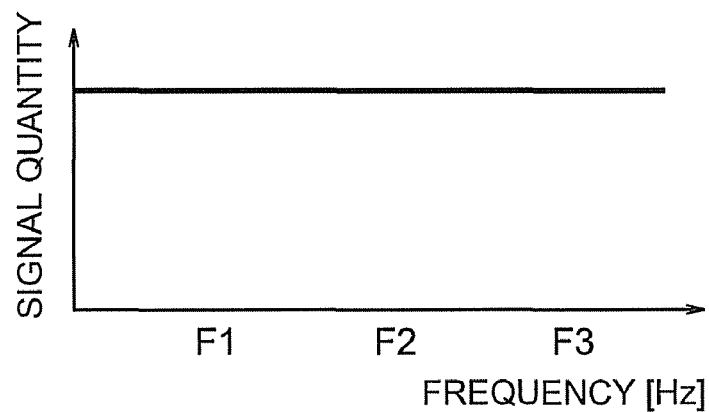
Figure 12C:
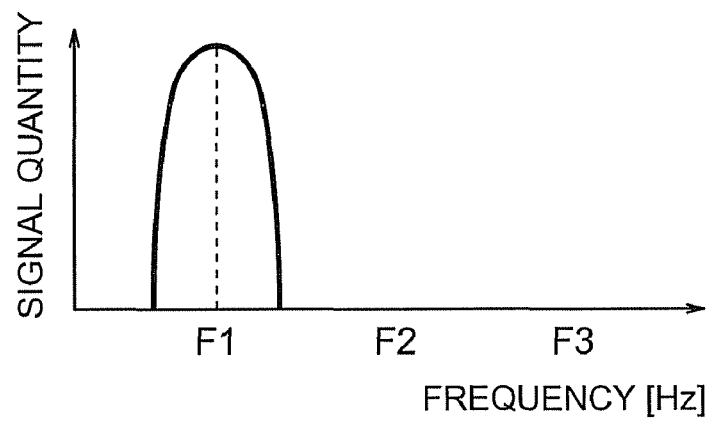

The switch 120 selects one of the band pass filters 131, 132 and 133 on the basis of a command given by the control circuit 140, and sends an input signal $S_{in}$ shown in FIG. 12B to the selected band pass filter, for example, the band pass filter 131. Thereupon, the signal passed through the band pass filter 131 is output via the switch 150 activated on the basis of a command given by the control circuit 140. The output signal is shown in FIG. 12C.

Eighth Embodiment

Figure 13A:
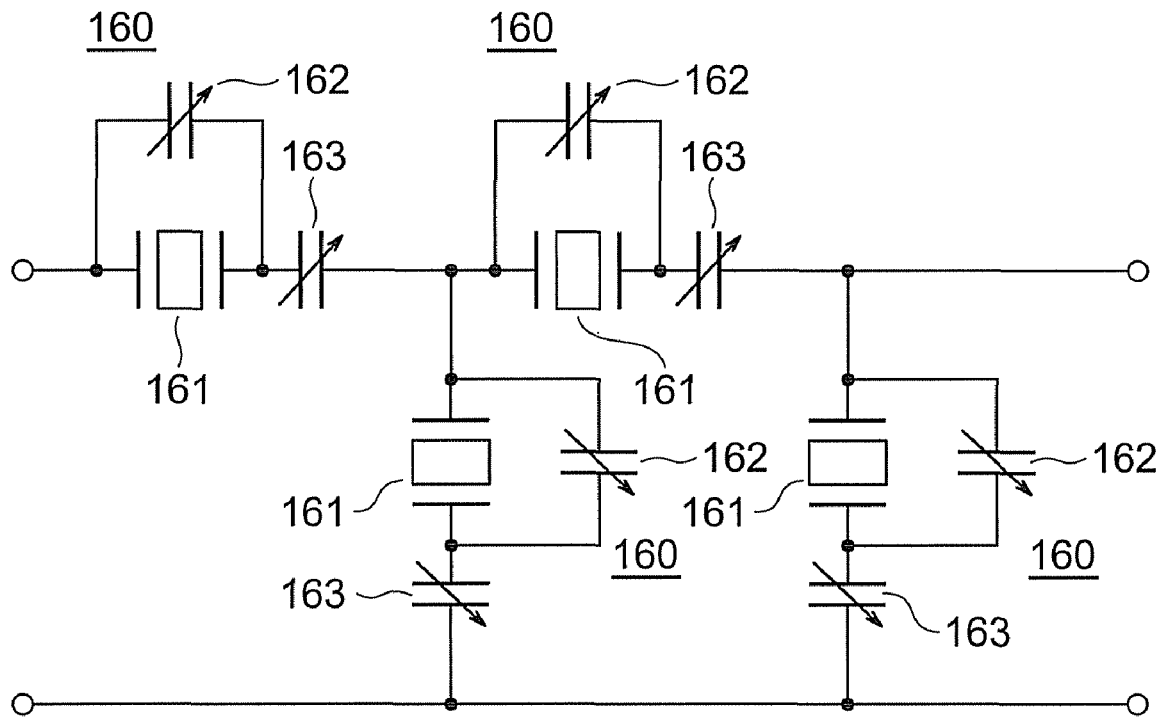
FIG. 13A is a circuit diagram of a tunable filter according to an eighth embodiment.
Figure 13B:
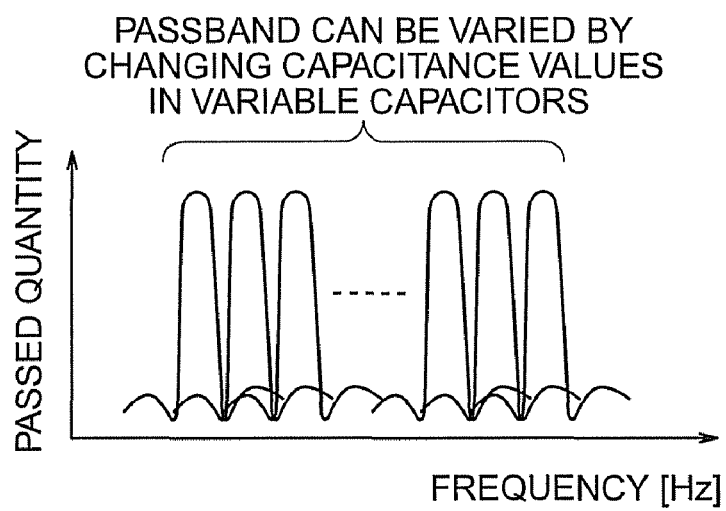
FIG. 13B is a diagram showing pass-bands of the tunable filter.

A tunable filter according to an eighth embodiment of the present invention is shown in FIG. 13A. The tunable filter according to the present embodiment includes a circuit obtained by connecting circuits 160 in a ladder form. Each of the circuits 160 includes a resonator 161, a variable capacitor 162 connected in parallel with the resonator 161, and a variable capacitor 163 connected in series with the resonator 161. As shown in FIG. 13B, the passband can be varied. The circuit 160 can change the resonance frequency and the antiresonance frequency of the resonator 161. As the variable capacitors 162 and 163, the piezoelectric driven MEMS device described with reference to the embodiments is used.

In the present embodiment, the circuits 160 each including the resonator 161 and the variable capacitors 162 and 163 connected respectively in parallel with and connected in series with the resonator 161 are connected in a ladder form. Even if the circuits 160 are connected in a lattice form, similar effects can be obtained.

Ninth Embodiment

An amplifier matching circuit according to a ninth embodiment of the present invention is shown in FIG. 14A.

In general, when connecting a circuit to an amplifier, it is desirable to match an impedance of a circuit connected in a stage preceding the amplifier with an input impedance of the amplifier and match an impedance of a circuit connected in a stage subsequent to the amplifier with an output impedance of the amplifier in order to prevent reflection from being caused by mismatching. When amplifying different frequency signals, it is necessary to achieve matching for respective frequencies. It becomes possible to achieve matching for respective frequencies by varying values of capacitors and inductors included in the matching circuit, i.e., capacitances and inductor inductances.

In the present embodiment, the piezoelectric driven MEMS device described with reference to the embodiments is used as the capacitors included in the matching circuit. As shown in FIG. 14A, the matching circuit according to the present embodiment includes variable capacitors 171 and 172, variable inductors 174, 175 and 176, and transistors 177 and 178.

A first end of the variable capacitor 171 is connected to an input end "in." A second end of the variable capacitor 171 is connected to the transistor 178 at its gate. A first end of the variable inductor 174 is connected to the input end "in." A second end of the variable inductor 174 is connected to ground. A first end of the variable inductor 175 is connected to a power supply. A second end of the variable inductor 175 is connected to the transistor 177 at its source and connected to a first end of the variable capacitor 172. The transistor 177 and the transistor 178 are connected in series. Drains of the transistor 177 and the transistor 178 are connected together. The transistor 178 is connected at its source to the ground via the variable inductor 176. The transistor 177 is connected at its gate to the power supply. A second end of the variable capacitor 172 is connected to an output end "out."

In the present embodiment, each of the variable inductors 174, 175 and 176 is implemented as a configuration in which a plurality of fixed inductors 180a, 180b and 180c connected in series can be changed over by switches 181 and 182, as shown in FIG. 14B. Each of the variable inductors may have a configuration in which a plurality of fixed inductors connected in parallel are changed over by switches.

Even if a piezoelectric driven actuator is warped by residual stress of a material included therein, the difference in displacement between the action parts connected to the piezoelectric driven actuator is held down and kept constant. By using the piezoelectric driven MEMS device structures according to the embodiments of the present invention as heretofore described in detail, it becomes possible to provide a MEMS vari-caps and MEMS switches having a control mechanism which is excellent in reproducibility and reliability. Thus, the industrial value of the present invention is extremely high.

What is claimed is:
1. A piezoelectric driven MEMS device, comprising:
a substrate;
a first actuator which has a first fixed end fixed at least at one end to the substrate, which comprises a first lower electrode, a first piezoelectric film formed on the first lower electrode, and a first upper electrode formed on the first piezoelectric film, and which can be operated by applying voltages to the first lower electrode and the first upper electrode;
a second actuator which has a second fixed end fixed at least at one end to the substrate, which is disposed in parallel with the first actuator, which comprises a second lower electrode, a second piezoelectric film formed on the second lower electrode, and a second upper electrode formed on the second piezoelectric film, and which can be operated by applying voltages to the second lower electrode and the second upper electrode;
an electric circuit element having a first action part connected to the first actuator and a second action part connected to the second actuator;
the first action part comprises a plurality of first comb teeth which are provided on a side part of the first actuator so as to be adjacent to the second actuator and which extend toward the second actuator, and each of the first comb teeth comprises a third lower electrode, a third piezoelectric film formed on the third lower electrode, and a third upper electrode formed on the third piezoelectric film, and
the second action part comprises a plurality of second comb teeth which are provided on a side part of the second actuator so as to be adjacent to the first actuator, which extend toward the first actuator and which are alternated with the first comb teeth, and each of the second comb teeth comprises a fourth lower electrode, a fourth piezoelectric film formed on the fourth lower electrode so as to become the same layer as the second piezoelectric film, and a fourth upper electrode formed on the fourth piezoelectric film.

2. The MEMS device according to claim 1, wherein
the second fixed end is located on a straight line which passes through the first fixed end and which is substantially perpendicular to an extension direction of the first actuator, and
a distance between the first fixed end of the first actuator and a position where the first action part is connected to the first actuator is substantially equal to a distance between the second fixed end of the second actuator and a position where the second action part is connected to the second actuator.

3. The MEMS device according to claim 1, wherein the electric circuit element is a variable capacitor.

4. A piezoelectric driven MEMS device comprising:
a substrate;
a first actuator which has a first fixed end fixed at least at one end to the substrate, which comprises a first lower electrode, a first piezoelectric film formed on the first lower electrode, and a first upper electrode formed on the first piezoelectric film, and which can be operated by applying voltages to the first lower electrode and the first upper electrode;
a second actuator which has a second fixed end fixed at least at one end to the substrate, which is disposed in parallel with the first actuator, which comprises a second lower electrode, a second piezoelectric film formed on the second lower electrode, and a second upper electrode formed on the second piezoelectric film, and which can be operated by applying voltages to the second lower electrode and the second upper electrode;
a third actuator which has a third fixed end fixed at least at one end to the substrate, which is disposed across the first actuator from the second actuator and in parallel with the first actuator, which comprises a third lower electrode, a third piezoelectric film formed on the third lower electrode, and a third upper electrode formed on the third piezoelectric film so as to become the same layer as the first upper electrode, and which can be operated by applying voltages to the third lower electrode and the third upper electrode; and
an electric circuit element having a first action part connected to the first actuator, a second action part connected to the second actuator, and a third action part connected to the third actuator.

5. The MEMS device according to claim 4, wherein
the second and third fixed ends are located on a straight line which passes through the first fixed end and which is substantially perpendicular to an extension direction of the first actuator, and
a distance between the first fixed end of the first actuator and a position where the first action part is connected to the first actuator, a distance between the second fixed end of the second actuator and a position where the second action part is connected to the second actuator, and a distance between the third fixed end of the third actuator and a position where the third action part is connected to the third actuator are substantially equal to each other.

6. The MEMS device according to claim 4, wherein
the first action part is connected to a second end of the first actuator, and the first action part comprises a fourth lower electrode and a fourth piezoelectric film,
the second action part comprises a first main body part connected to a second end of the second actuator and a first extension part connected to the first main body part to extend toward the first action part, the first main body part comprises a fifth lower electrode, a fifth piezoelectric film formed on the fifth lower electrode, and a fourth upper electrode formed on the fifth piezoelectric film, the first extension part comprises a first extension electrode, and a tip part of the first extension electrode overlaps the third lower electrode of the first action part when viewed from the substrate side, and
the third action part comprises a second main body part connected to a second end of the third actuator and a second extension part connected to the second main body part to extend toward the first action part, the second main body part comprises a sixth lower electrode, a sixth piezoelectric film formed on the sixth lower electrode, and a fifth upper electrode formed on the sixth piezoelectric film, the second extension part comprises a second extension electrode, and a tip part of the second extension electrode overlaps the third lower electrode of the first action part when viewed from the substrate side.

7. A piezoelectric driven MEMS device, comprising:
a substrate;
a first actuator which has a first fixed end fixed at least at one end to the substrate, which comprises a first lower electrode, a first lower piezoelectric film formed on the first lower electrode, a first intermediate electrode formed on the first lower piezoelectric film, a first intermediate electrode formed on the first lower piezoelectric film, a first upper piezoelectric film formed on the first intermediate electrode, and a first upper electrode formed on the first upper piezoelectric film, and which can be operated by applying voltages to the first intermediate electrode and at least one of the first lower electrode and the first upper electrode;

a second actuator which has a second fixed end fixed at least at one end to the substrate, which is disposed in parallel with the first actuator, which comprises a second lower electrode, a second piezoelectric film formed on the second lower electrode, a second intermediate electrode formed on the second lower piezoelectric film, a second upper piezoelectric film formed on the second intermediate electrode, and a second upper electrode formed on the second upper piezoelectric film, and which can be operated by applying voltages to the second intermediate electrode and at least one of the second lower electrode and the second upper electrode;

an electric circuit element having a first action part connected to the first actuator and a second action part connected to the second actuator the first action part comprises a plurality of first comb teeth which are provided on a side part of the first actuator so as to be adjacent to the second actuator and which extend toward the second actuator, and each of the first comb teeth comprises a third lower electrode, a third lower piezoelectric film formed on the third lower electrode, a third intermediate electrode formed on the third lower piezoelectric film, a third upper piezoelectric film formed on the third intermediate electrode, and a third upper electrode formed on the third upper piezoelectric film, and the second action part comprises a plurality of second comb teeth which are provided on a side part of the second actuator so as to be adjacent to the first actuator, which extend toward the first actuator and which are alternated with the first comb teeth, and each of the second comb teeth comprises a fourth lower electrode, a fourth lower piezoelectric film formed on the fourth lower electrode, a fourth intermediate electrode formed on the fourth lower piezoelectric film, a fourth upper piezoelectric film formed on the fourth intermediate electrode, and a fourth upper electrode formed on the fourth piezoelectric film.

8. The MEMS device according to claim 7 wherein the second fixed end is located on a straight line which passes through the first fixed end and which is substantially perpendicular to an extension direction of the first actuator, and a distance between the first fixed end of the first actuator and a position where the first action part is connected to the first actuator is substantially equal to a distance between the second fixed end of the second actuator and a position where the second action part is connected to the second actuator.

9. The MEMS device according to claim 7, wherein the electric circuit element is a variable capacitor.

10. A piezoelectric driven MEMS device, comprising:

a substrate;

a first actuator which has a first fixed end fixed at least at one end to the substrate, which comprises a first lower electrode, a first piezoelectric film formed on the first lower electrode, and a first upper electrode formed on the first piezoelectric film, and which can be operated by applying voltages to the first lower electrode and the first upper electrode;

a second actuator which has a second fixed end fixed at least at one end to the substrate, which is disposed in parallel with the first actuator, which comprises a second lower electrode, a second piezoelectric film formed on the second lower electrode, and a second upper electrode formed on the second piezoelectric film, and which can be operated by applying voltages to the second lower electrode and the second upper electrode;

an electric circuit element having a first action part connected to the first actuator and a second action part connected to the second actuator, wherein the first action part comprises a first main body part provided on a side part of the first actuator along the first actuator so as to be adjacent to the second actuator, a first connection part which connects the first actuator to the first main body part so as to electrically insulate them from each other, and a first extension part connected to the first main body part to extend toward the second actuator, the first main body part comprises a third lower electrode, a third lower piezoelectric film formed on the third lower electrode, a third intermediate electrode formed on the third lower piezoelectric film, a third upper piezoelectric film formed on the third intermediate electrode, and a third upper electrode formed on the third upper piezoelectric film, and the first extension part comprises a first extension electrode, and the second action part comprises a second main body part provided on a side part of the second actuator along the second actuator so as to be adjacent to the first actuator, a second connection part which connects the second actuator to the second main body part so as to electrically insulate them from each other, and a second extension part connected to the second main body part to extend toward the first actuator, the second main body part comprises a fourth lower electrode, a fourth lower piezoelectric film formed on the fourth lower electrode, a fourth intermediate electrode formed on the fourth lower piezoelectric film, a fourth upper piezoelectric film formed on the fourth intermediate electrode, and a fourth upper electrode formed on the fourth upper piezoelectric film, and the second extension part comprises a second extension electrode, and the first connection part comprises piezoelectric films, and the second connection part comprises piezoelectric films.

11. A piezoelectric driven MEMS device comprising:

a substrate;

a first actuator which has a first fixed end fixed at least at one end to the substrate, which comprises a first lower electrode, a first lower piezoelectric film formed on the first lower electrode, a first intermediate electrode formed on the first lower piezoelectric film, a first intermediate electrode formed on the first lower piezoelectric film, a first upper piezoelectric film formed on the first intermediate electrode, and a first upper electrode formed on the first upper piezoelectric film, and which can be operated by applying voltages to the first intermediate electrode and at least one of the first lower electrode and the first upper electrode;

a second actuator which has a second fixed end fixed at least at one end to the substrate, which is disposed in parallel with the first actuator, which comprises a second lower electrode, a second lower piezoelectric film formed on the second lower electrode, a second intermediate electrode formed on the second lower piezoelectric film, a second upper piezoelectric film formed on the second intermediate electrode, and a second upper electrode formed on the second upper piezoelectric film, and which can be operated by applying voltages to the second intermediate electrode and at least one of the second lower electrode and the second upper electrode;

a third actuator which has a third fixed end fixed at least at one end to the substrate, which is disposed across the first actuator from the second actuator and in parallel with the first actuator, which comprises a third lower electrode, a third lower piezoelectric film formed on the third lower electrode, a third intermediate electrode formed on the third lower piezoelectric film, a third upper piezoelectric film formed on the third intermediate electrode, and a third upper electrode formed on the third upper piezoelectric film, and which can be operated by applying voltages to the third intermediate electrode and at least one of the third lower electrode and the third upper electrode; and an electric circuit element having a first action part connected to the first actuator, a second action part connected to the second actuator, and a third action part connected to the third actuator.

12. The MEMS device according to claim 11, wherein the second and third fixed ends are located on a straight line which passes through the first fixed end and which is substantially perpendicular to an extension direction of the first actuator, and a distance between the first fixed end of the first actuator and a position where the first action part is connected to the first actuator, a distance between the second fixed end of the second actuator and a position where the second action part is connected to the second actuator, and a distance between the third fixed end of the third actuator and a position where the third action part is connected to the third actuator are substantially equal to each other.

13. The MEMS device according to claim 12 wherein the first action part is connected to a second end of the first actuator, and the first action part comprises a fourth lower electrode and a fourth piezoelectric film, the second action part comprises a first main body part connected to a second end of the second actuator and a first extension part connected to the first main body part to extend toward the first action part, the first main body part comprises a fifth lower electrode, a fifth lower piezoelectric film formed on the fifth lower electrode, a fourth intermediate electrode formed on the fifth lower piezoelectric film, a fourth upper piezoelectric film formed on the fourth intermediate electrode, and a fourth upper electrode formed on the fourth piezoelectric film, the first extension part comprises a first extension electrode, and a tip part of the first extension electrode overlaps the third lower electrode of the first action part when viewed from the substrate side, and the third action part comprises a second main body part connected to a second end of the third actuator and a second extension part connected to the second main body part to extend toward the first action part, the second main body part comprises a sixth lower electrode, a sixth lower piezoelectric film formed on the sixth lower electrode, a fifth intermediate electrode formed on the sixth lower piezoelectric film, a fifth upper piezoelectric film formed on the fifth intermediate electrode, and a fifth upper electrode formed on the fifth upper piezoelectric film, the second extension part comprises a second extension electrode, and a tip part of the second extension electrode overlaps the third lower electrode of the first action part when viewed from the substrate side.

* * * * *